United States Patent
Koo et al.

(10) Patent No.: US 9,024,858 B2
(45) Date of Patent: May 5, 2015

(54) DISPLAY PANEL WITH IMPROVED GATE DRIVER

(75) Inventors: Bon-Yong Koo, Cheonan-si (KR); Beom Jun Kim, Seoul (KR); Ho Kyoon Kwon, Seoul (KR)

(73) Assignee: Samsung Display Co., Ltd. (KR)

( * ) Notice: Subject to any disclaimer, the term of this patent is extended or adjusted under 35 U.S.C. 154(b) by 138 days.

(21) Appl. No.: 13/442,583

(22) Filed: Apr. 9, 2012

(65) Prior Publication Data

US 2013/0106677 A1  May 2, 2013

(30) Foreign Application Priority Data

Oct. 26, 2011 (KR) .................. 10-2011-0109850

(51) Int. Cl.
*G09G 3/36* (2006.01)
*G11C 19/28* (2006.01)
*G11C 19/00* (2006.01)

(52) U.S. Cl.
CPC .......... *G09G 3/36* (2013.01); *G09G 2310/0267* (2013.01); *G09G 2310/0286* (2013.01); *G09G 2320/0209* (2013.01); *G11C 19/28* (2013.01)

(58) Field of Classification Search
CPC .................................................. G09G 3/3677
USPC ..................................... 345/100, 204; 377/64
See application file for complete search history.

(56) References Cited

U.S. PATENT DOCUMENTS

| | | | |
|---|---|---|---|
| 7,256,775 B2 | 8/2007 | Eom | |
| 7,663,395 B2 * | 2/2010 | Chang et al. | 345/87 |
| 2005/0078057 A1 * | 4/2005 | Chang et al. | 345/55 |
| 2005/0083292 A1 * | 4/2005 | Moon et al. | 345/100 |
| 2005/0285827 A1 | 12/2005 | Eom | |
| 2007/0007557 A1 * | 1/2007 | Kwak et al. | 257/239 |
| 2007/0040792 A1 * | 2/2007 | Kwag et al. | 345/100 |
| 2007/0290967 A1 * | 12/2007 | Jang et al. | 345/87 |
| 2008/0079701 A1 | 4/2008 | Shin et al. | |
| 2008/0211760 A1 | 9/2008 | Baek et al. | |
| 2009/0115690 A1 * | 5/2009 | Chang et al. | 345/55 |
| 2009/0179875 A1 * | 7/2009 | Li et al. | 345/204 |
| 2010/0045644 A1 | 2/2010 | Lee et al. | |
| 2010/0277206 A1 * | 11/2010 | Lee et al. | 327/108 |
| 2010/0302872 A1 | 12/2010 | Lee | |

(Continued)

FOREIGN PATENT DOCUMENTS

| | | |
|---|---|---|
| JP | 4152934 | 7/2008 |
| KR | 100155915 B1 | 7/1998 |
| KR | 100218514 B1 | 6/1999 |

(Continued)

*Primary Examiner* — Adam J Snyder
(74) *Attorney, Agent, or Firm* — Innovation Counsel LLP

(57) ABSTRACT

The present invention divides a wire supplying a scan start signal to a gate driver into two wires, so as to avoid overlapping a clock signal line. In this way the clock signal is not delayed by interference, and a gate driving margin may continue uninterrupted, thereby uniformly outputting a gate-on voltage. In particular, if the clock signal line is connected to all stages in the gate driver and the clock signal line overlaps the scan start signal line, unsightly horizontal bands appear on the image and the parallel gate lines generate a very large parasitic capacitance. In contrast, the gate drivers in the present disclosure comprise clock signal lines which do not overlap the scan start signal lines. As benefits, interference resulting in horizontal banding is minimized and the power consumption may be reduced by about 10%.

16 Claims, 10 Drawing Sheets
(3 of 10 Drawing Sheet(s) Filed in Color)

(56) References Cited

U.S. PATENT DOCUMENTS

2011/0063278 A1    3/2011  Han
2011/0069044 A1*   3/2011  Lee et al. ............... 345/204

FOREIGN PATENT DOCUMENTS

KR    1020060023698 A    3/2006
KR    100578812          5/2006

* cited by examiner

DISPLAY PANEL WITH IMPROVED GATE DRIVER

CROSS-REFERENCE TO RELATED APPLICATION

This application claims priority to and the benefit of Korean Patent Application No. 10-2011-0109850 filed in the Korean Intellectual Property Office on Oct. 26, 2011, the entire contents of which are incorporated herein by reference.

BACKGROUND OF THE INVENTION (a) Field of the Invention

The present invention relates to a display panel, and preferably relates to a display panel having a gate driver integrated with a display panel.

(b) Description of the Related Art

As a widely used flat panel display, the liquid crystal display (LCD) includes two glass panels, one provided with field generating electrodes such as pixel electrodes, and the other with a common electrode, and a liquid crystal layer interposed between the two panels. The LCD produces images by applying a potential to the field-generating electrodes, with the electric field re-orienting the LC molecules to change the transmission of incident polarized light. Other examples of flat panel displays include an organic light emitting device, a plasma display device, and an electrophoretic display.

All these display devices include a gate driver and a data driver. Manufacturing cost is typically reduced by replacing a separate gate driving chip with an integrated gate driver formed on the panel. The gate driver may be integrated with the panel by being patterned with the array of gate lines, data lines, and thin film transistors. The integrated gate driver is supplied with a plurality of control signals external to the panel, so wires transmitting those control signals must also be formed in the panel. The current design trend toward reduced bezel width of the panel reduces the spacing between the plurality of transmission wires on the panel. Such a reduced spacing between transmission wires may generate interference between the plurality of control signals. Of particular significance among the control signals supplied to the gate driver, the scan start signal is essential to time when each gate driver generates an output. If the timing of a control signal is delayed due to such interference, the gate driver may not output a gate-on voltage at an appropriate time. As a result of the interference, horizontal stripes appear superimposed upon the image which mar the display quality.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention reduces signal interference between a plurality of control signals supplied to a gate driver formed on a display panel to output a gate voltage of uniform waveform.

A display panel according to an exemplary embodiment includes: a display area including a gate line and a data line; and a gate driver connected to one end of the gate line. The gate driver includes a plurality of normal stages and dummy stages, and is integrated on a substrate to output a gate voltage. Within the gate driver, a first stage among the normal stages and a dummy stage of the dummy stages is supplied with a scan start signal, which is transmitted through a first scan start signal wire and a second scan start signal wire. The first scan start signal wire transmits the scan start signal to the dummy stage, while the second scan start signal wire transmits the scan start signal to the first stage of the normal stages.

The plurality of normal stages and the dummy stages may be disposed in one line, and may be alternately supplied with a clock signal by a wire.

The first scan start signal wire and the second scan start signal wire may be formed on opposite sides of the wire carrying the clock signal.

The wire and the first scan start signal wire carrying the clock signal may be formed on the same layer as the gate line, and the second scan start signal wire may be formed on the same layer as the gate line and the data line, thereby having a dual-layered structure.

The wire supplying the clock signal may have a connection to the plurality of normal stages and dummy stages, and the connection may be formed on the same layer as the data line.

The second scan start signal wire may only be formed on the same layer as the gate line at a portion connected to the first stage.

A flexible printed circuit may be attached to one side of the display panel, and a printed circuit board (PCB) may be attached to the other end of the flexible printed circuit. One scan start signal may be output in a driving voltage generating circuit of the printed circuit board (PCB), and the flexible printed circuit may divide one scan start signal into two wires and transmit them separately to the display panel.

Each normal stage may receive the clock signal, a first low voltage and a second low voltage lower than the first low voltage, at least one transmission signal from among previous stages, and at least two transmission signals from among following stages to output a gate voltage having the first low voltage as the gate-off voltage.

The gate voltage when the transmission signal is low may be the second low voltage.

The normal stage may include an input section, a pull-up driver, a pull-down driver, an output unit, and a transmission signal generator.

The dummy stage may include a first dummy stage and a second dummy stage.

The first dummy stage may receive the clock signal, the first low voltage and the second low voltage lower than the first low voltage, at least one transmission signal from among the previous stages, at least one transmission signal from among the following stages, and the scan start signal to output a dummy gate voltage having the first low voltage as the gate-off voltage.

The second dummy stage may receive the clock signal, the first low voltage and the second low voltage lower than the first low voltage, the transmission signal of the first dummy stage, and the scan start signal to output a dummy gate voltage having the first low voltage as the gate-off voltage.

The normal stage may include a seventeenth transistor, for which the control terminal of the seventeenth transistor is connected to a second input terminal of the normal stage; an input terminal of the seventeenth transistor is connected to a transmission signal output terminal of the normal stage; and an output terminal of the seventeenth transistor is connected to a second voltage input terminal of the normal stage. The first dummy stage and the second dummy stage may also include their respective seventeenth transistors, in each of which a control terminal of the transistor is connected to a dummy stage first input terminal, an input terminal of the transistor is connected to a dummy stage transmission signal output terminal, and an output terminal of the transistor is connected to a dummy stage second voltage input terminal.

The normal stage may include a diode-connected sixteenth transistor, and the first dummy stage and the second dummy stage may not form an additional element at a position corresponding to the sixteenth transistor.

The normal stage and the first dummy stage may each include a sixth transistor, in which a control terminal of the sixth transistor is connected to a third input terminal of a stage; an output terminal of the sixth transistor is connected to the second voltage input terminal of a stage; and an input terminal of the sixth transistor is connected to a Q node of a stage. The second dummy stage may not form an additional element at a position corresponding to the sixth transistor, and does not have a third input terminal.

The second dummy stage may further include an eighteenth transistor, for which a control terminal of the eighteenth transistor is connected to a second input terminal of the second dummy stage; an input terminal of the eighteenth transistor is connected to a transmission signal output terminal of the second dummy stage; and an output terminal of the eighteenth transistor is connected to a second voltage input terminal.

The second dummy stage may further include a nineteenth transistor, and the nineteenth transistor may include a transistor control terminal connected to a transmission signal output terminal of the second dummy stage, a transistor input terminal connected to a Q node of the second dummy stage, and a transistor output terminal connected to the second voltage input terminal of the second dummy stage.

In an exemplary embodiment, a wire supplying a scan start signal to a gate driver is divided into two wires so that the wires transmitting the clock signal and the scan start signal avoid being overlapped, and their signals interfering. Consequently, the scan start signal is not delayed. Furthermore, because the scan start signal and the clock signal do not overlap, excess parasitic capacitance is not generated which would otherwise increase the power consumption. The power consumption of the exemplary embodiment is thereby reduced by about 10% relative to designs in which the clock and scan start wires overlap.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

DETAILED DESCRIPTION OF THE EMBODIMENTS

Figure 1:
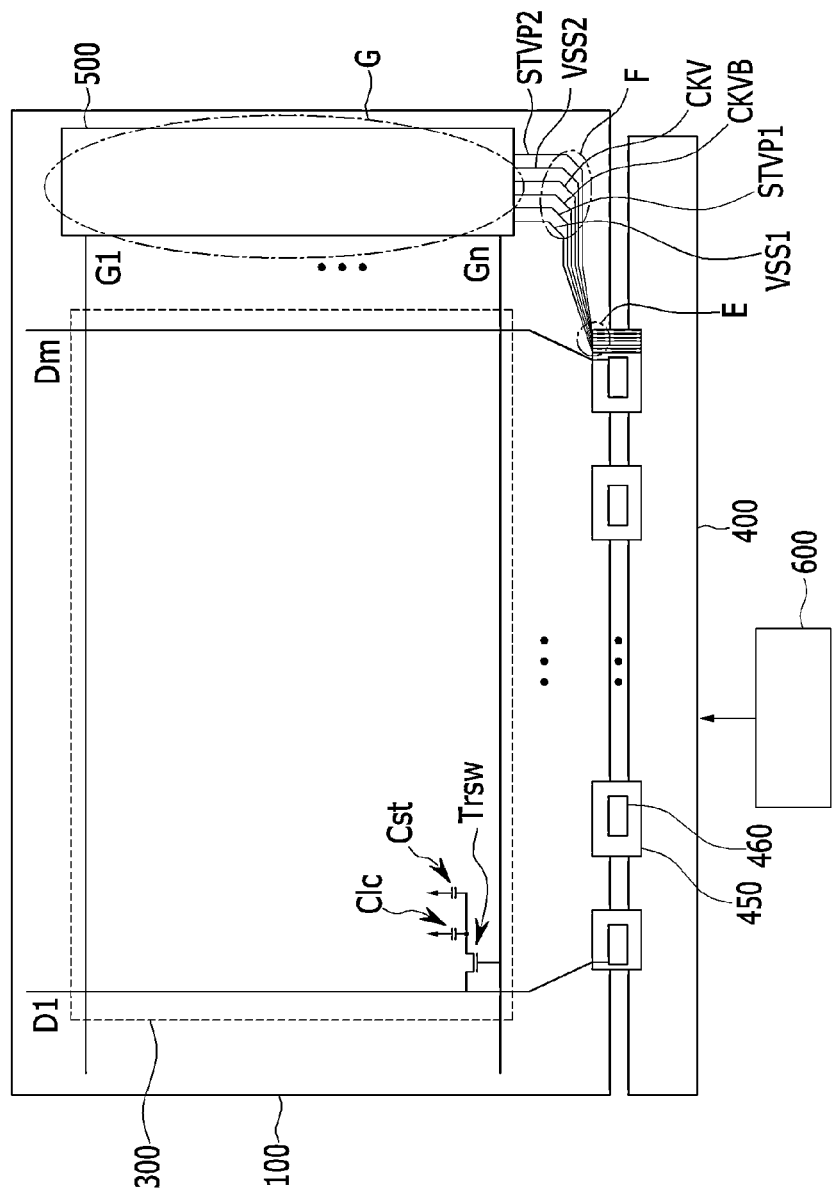
FIG. 1 is a top plan view of a display panel according to an exemplary embodiment of the present invention.

The present invention will be described more fully hereinafter with reference to the accompanying drawings, in which exemplary embodiments are shown. As those skilled in the art will realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A display device will be described with reference to FIG. 1, a top plan view of a display panel according to an exemplary embodiment. In FIG. 1, a display panel 100 includes a display area 300 displaying images, and a gate driver 500 supplying a gate voltage to a gate line of the display area 300. Concomitantly, a data line of the display area 300 receives a data voltage from a data driver IC 460 formed on a flexible printed circuit film (FPC) 450 connected to the display panel 100. The gate driver 500 and the data driver IC 460 are controlled by the signal controller 600, mounted on an external printed circuit board (PCB). The external PCB is formed outside the flexible printed circuit film 450, and transmits a signal from the signal controller 600 to the data driver IC 460 and the gate driver 500.

The signals provided from the signal controller 600 to the data driver IC 460 and the gate driver 500 may include a first clock signal CKV, a second clock signal CKVB, a scan start signal STVP, and a signal providing low voltages Vss1 and Vss2 of a particular level. The scan start signal STVP is transmitted through two wires (a first scan start signal wire STVP1 and a second scan start signal wire STVP2). In an exemplary embodiment, if the signals connected to the gate driver 500 from the signal controller 600 are labeled sequentially from the outside of the display panel 100, the second scan start signal wire STVP2 transmitting the scan start signal STVP; a wire carrying the second low voltage Vss2; a wire transmitting the first clock signal CKV; a wire transmitting the second clock signal CKVB; the first scan start signal wire STVP1 transmitting the scan start signal STVP; and a wire carrying the first low voltage Vss1 are formed.

Furthermore, in the display panel according to an exemplary embodiment, the gate driver 500 is positioned at the right region of the display panel 100 shown in FIG. 1, and the flexible printed circuit film 450, the data driver IC 460, and the printed circuit board (PCB) 400 are attached to the lower edge of the display panel 100.

For a liquid crystal panel, the display area 300 includes a thin film transistor Trsw, a liquid crystal capacitor Clc, and a storage capacitor Cst. FIG. 1 shows an example of such a liquid crystal panel. Similarly, an organic light emitting panel incorporates a thin film transistor and an organic light emitting diode, while another display panel includes an element such as a thin film transistor to form the display area 300. Hereafter, a liquid crystal panel is described as an example.

The LCD panel display area 300 includes a plurality of gate lines G1-Gn and a plurality of data lines D1-Dm. The plurality of gate lines G1-Gn and the plurality of data lines D1-Dm are insulated from one another and cross each other.

Each pixel PX includes a thin film transistor Trsw, a liquid crystal capacitor Clc, and a storage capacitor Cst. As depicted in FIG. 1, one control terminal of the thin film transistor Trsw is connected to one gate line, while an input terminal of the thin film transistor Trsw is connected to one data line. The output terminal of the thin film transistor Trsw is connected to one terminal of a liquid crystal capacitor Clc and to one terminal of a storage capacitor Cst. The other terminal of the liquid crystal capacitor Clc is connected to a common electrode. The other terminal of the storage capacitor Cst is connected to a storage voltage Vcst supplied by the signal controller 600.

The plurality of data lines D1-Dm receive the data voltages from the data driver IC 460, while the plurality of gate lines G1-Gn receive the gate voltages from the gate driver 500.

The data driver 460 may be connected on an upper or lower side of the display panel 100 to the data lines D1-Dm formed at an upper or lower side of the display panel 100, and extending along the vertical direction in FIG. 1. In the exemplary embodiment shown in FIG. 1, the data driver IC 460 is positioned at the lower side of the display panel 100.

The gate driver 500 receives the clock signals CKV and CKVB; the scan start signal STVP; the first low voltage Vss1 corresponding to the gate-off voltage; and the second low voltage Vss2 that is lower than the gate-off voltage to generate the gate voltage (the gate-on voltage and the gate-off voltage); and sequentially applies the gate-on voltage to the gate lines G1-Gn. The gate driver 500 may be formed on the left side or the right side of the display panel 100. In the exemplary embodiment of FIG. 1, the gate driver 500 is formed on the right side.

The clock signals CKV and CKVB, the scan start signal STVP, the first low voltage Vss1, and the second low voltage Vss2 are provided to the gate driver 500 through the flexible printed circuit film 450 at region E, as shown in FIG. 1. These signals are transmitted from the outside or from the signal controller 600 to the flexible printed circuit film 450 through the printed circuit board (PCB) 400.

Now that the overall structure of the display device has been described, the gate driver 500 within will be described in detail.

Figure 2:
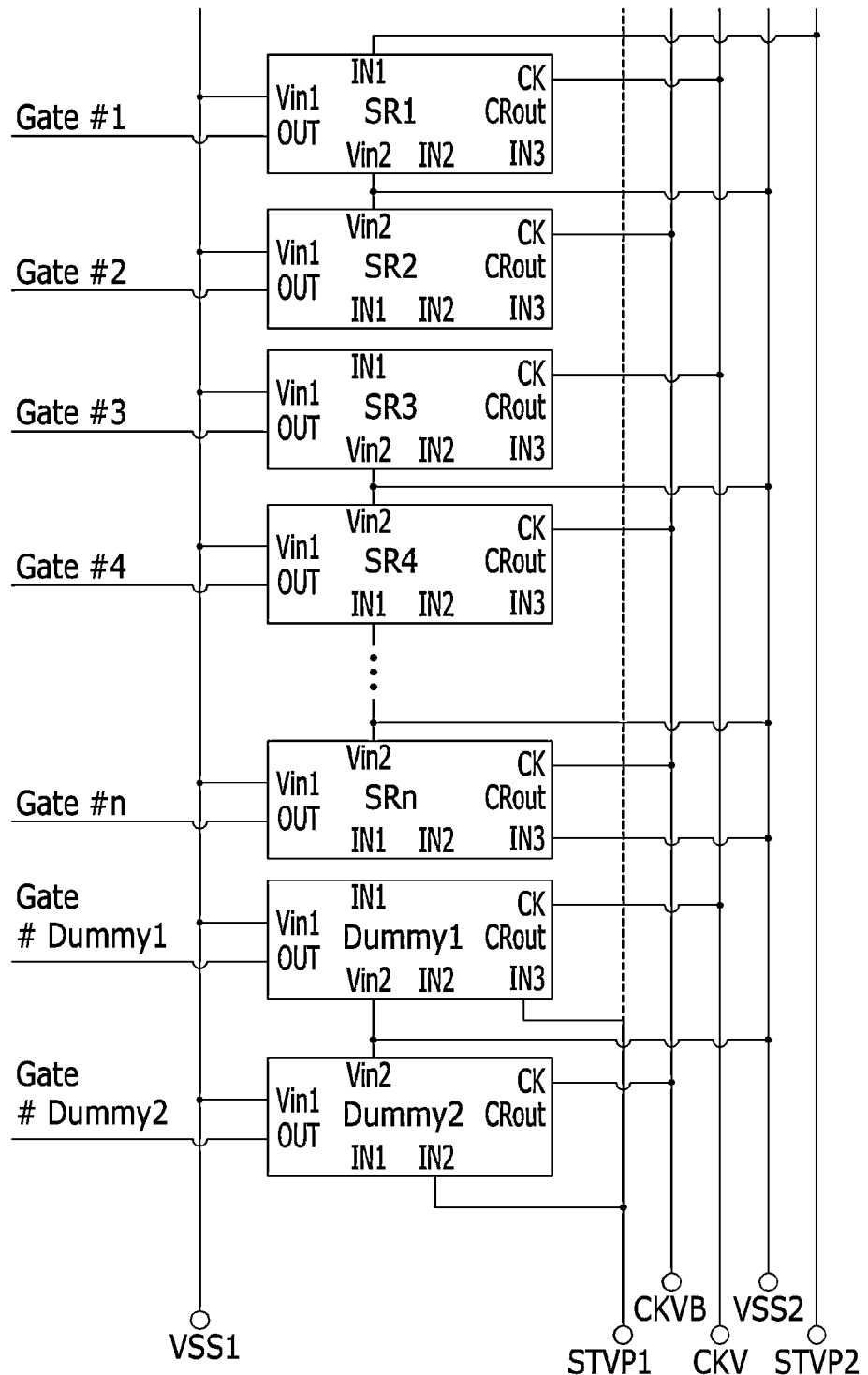
FIG. 2 is a block diagram showing a gate driver and a gate line shown in FIG. 1 in detail.

FIG. 2 is a block diagram showing the gate driver 500 and the array of gate lines G1-Gn shown to extend horizontally in FIG. 1.

Figure 3:
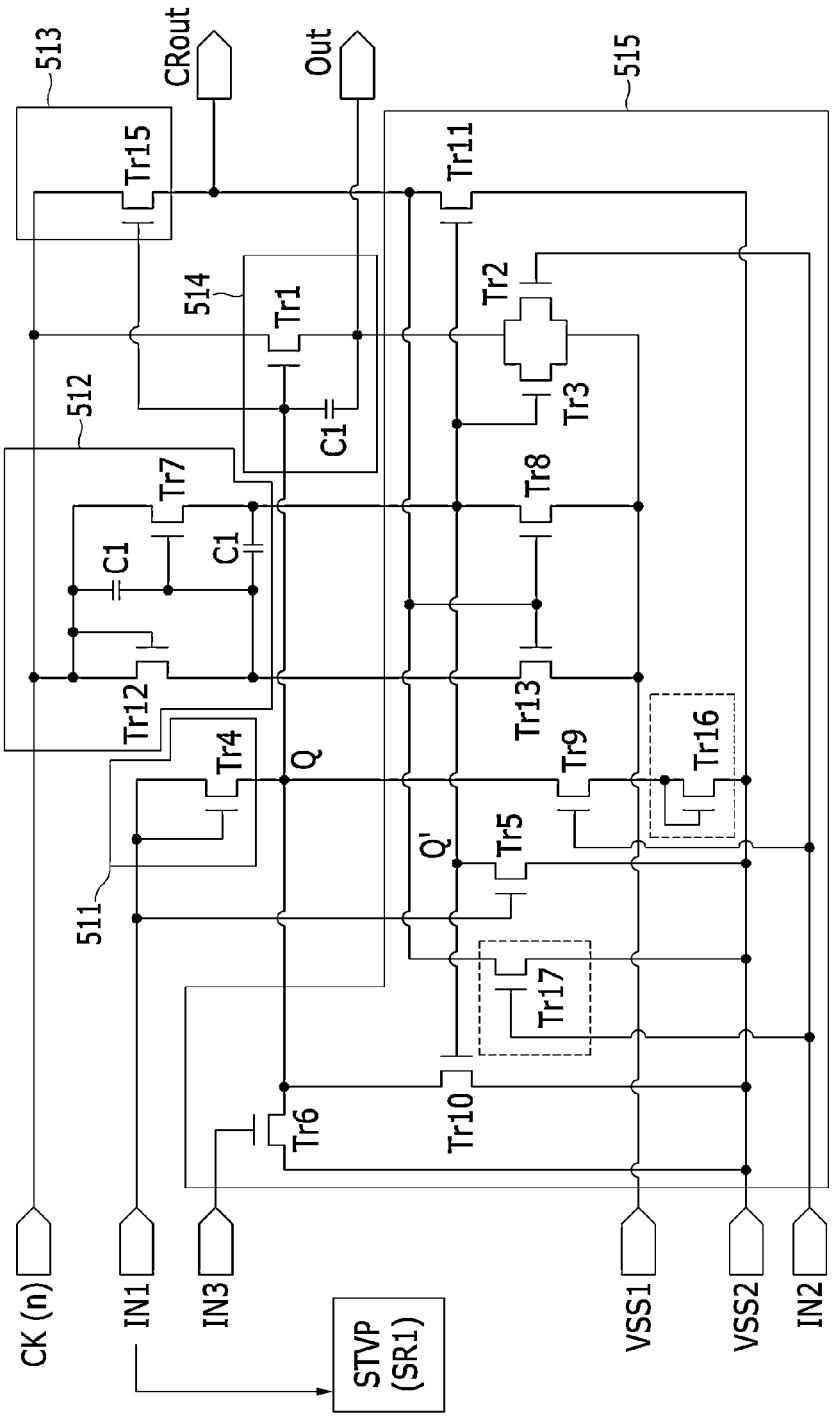
FIG. 3 is a circuit diagram of a normal stage in the gate driver of FIG. 2.

FIG. 3 is a circuit diagram of a normal stage in the gate driver of FIG. 2.

Figure 4:
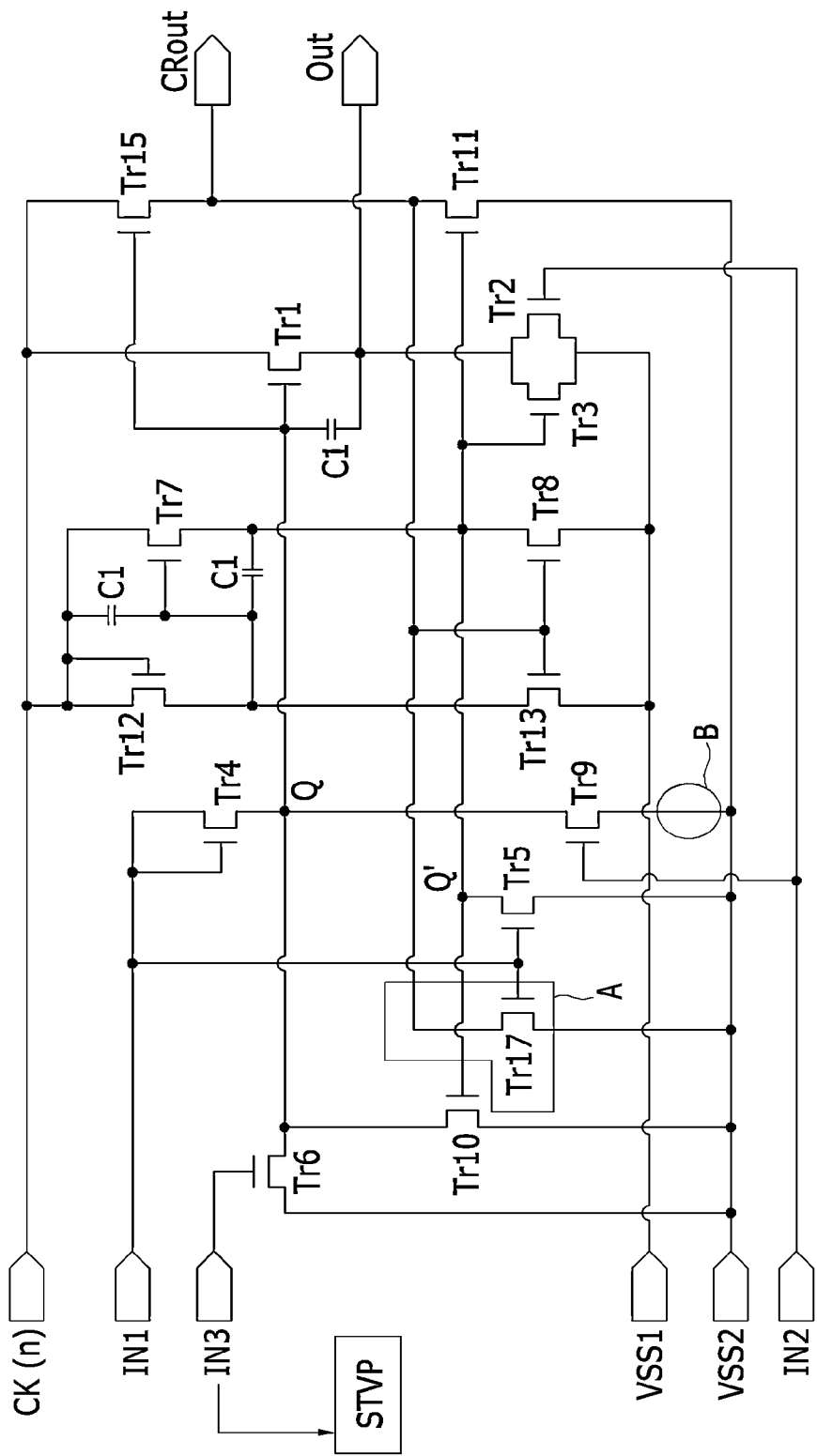
FIG. 4 is a circuit diagram of a first dummy stage in the gate driver of FIG. 2.

FIG. 4 is a circuit diagram of a first dummy stage in the gate driver of FIG. 2.

Figure 5:
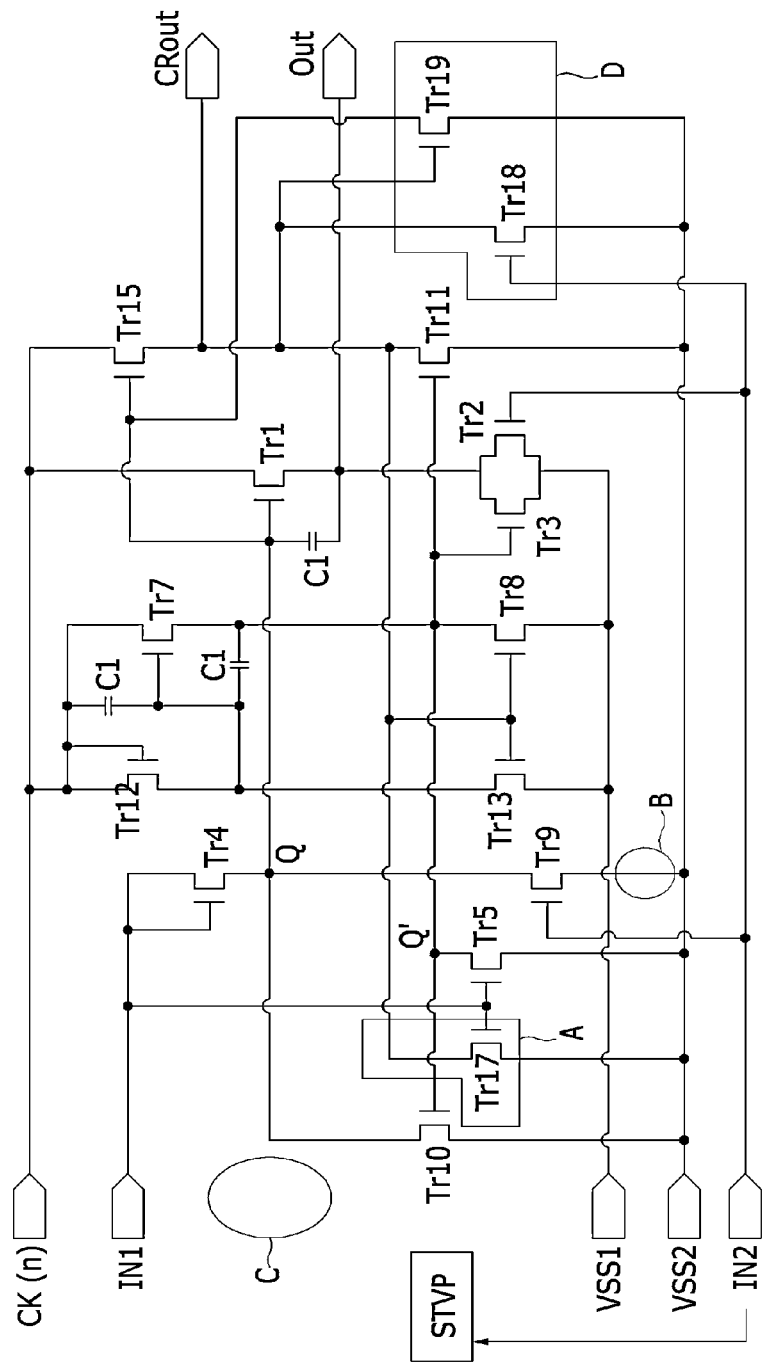
FIG. 5 is a circuit diagram of a second dummy stage in the gate driver of FIG. 2.

FIG. 5 is a circuit diagram of a second dummy stage in the gate driver of FIG. 2.

FIG. 2 shows the gate driver 500 as a detailed block. The gate driver 500 according to an exemplary embodiment includes the same number of normal stages as the number of gate lines n, plus two additional dummy stages (namely, the first and second dummy stages).

The gate driver 500 includes a plurality of stages SR1, SR2, . . . SRn which are dependently interconnected to each other and to dummy stages Dummy1 and Dummy2. The normal stages SR1, SR2, . . . SRn are sequentially positioned, then the first and second dummy stages Dummy1 and Dummy2 are sequentially positioned.

FIG. 3 depicts a normal stage in the gate driver. Each stage SR1, SR2, . . . SRn includes three input terminals IN1, IN2, and IN3; one clock input terminal CK; two voltage input terminals Vin1 and Vin2; a gate voltage output terminal OUT outputting the gate voltage; and a transmission signal output terminal CRout.

FIG. 4 depicts the first dummy stage, Dummy1. As shown, the first dummy stage includes three input terminals IN1, IN2, and IN3; one clock input terminal CK; two voltage input terminals Vin1 and Vin2; a gate voltage output terminal OUT outputting the gate voltage; and a transmission signal output terminal CRout.

In contrast, with reference to FIG. 5, the second dummy stage Dummy2 includes but two input terminals IN1 and IN2; one clock input terminal CK; two voltage input terminals Vin1 and Vin2; the gate voltage output terminal OUT outputting the gate voltage; and the transmission signal output terminal CRout.

Comparing FIG. 3 to FIG. 5, the normal stages SR1, SR2, . . . SRn and the dummy stages Dummy1 and Dummy2 have different connectivities.

In all normal stages SR1, SR2, . . . SRn and both dummy stages Dummy1 and Dummy2, each terminal has characteristics as follows.

Each stage's first input terminal IN1 is connected to the transmission signal output terminal CRout of the previous stage, thereby receiving the transmission signal CR of the previous stage. Since the first stage does not have a previous stage, the scan start signal STVP is supplied to the first input terminal IN1.

Each stage's second input terminal IN2 is connected to the transmission signal output terminal CRout of the following stage, thereby receiving the transmission signal CR of the following stage. Since the second dummy stage Dummy2 does not have a following stage, the scan start signal STVP is supplied to the second input terminal IN2 of Dummy2.

Each stage's third input terminal IN3 is connected to the transmission signal output terminal CRout of the stage after the following stage, thereby receiving the transmission signal CR of the stage after the following stage. The first dummy stage Dummy1 does not have a stage after its following stage, and consequently the scan start signal STVP is supplied to the third input terminal IN3 of Dummy 1. And with reference to FIG. 5, the second dummy stage Dummy2 has no third input terminal IN3.

The stage SRn driving the n-th gate line Gn may have two dummy stages Dummy1 and Dummy2 to receive the transmission signal CR from the next stage and the stage after the following stage. The dummy stages Dummy1 and Dummy2 are stages that generate and output their own dummy gate voltages, which are different from the gate voltages generated by the normal stages SR1-SRn. That is, the gate voltages outputted by the stages SR1-SRn are transmitted through their respective gate lines such that each data voltage is supplied to its pixel for the display of an image. The dummy stages Dummy1 and Dummy2, however, may not be connected to the gate lines. If the dummy stages are connected to the gate lines, they are connected to the gate lines of dummy pixels (not shown) that do not display an image. The dummy stages Dummy1 and Dummy2 also have different structures from the normal stages SR1-SRn, as shown in FIG. 4 and FIG. 5.

All clock terminals CK are supplied with a clock signal. The clock terminals CK of the odd-numbered stages are supplied with the first clock signal CKV. The clock terminals CK of the even-numbered stages are supplied with the second clock signal CKVB. The first clock signal CKV and the second clock signal CKVB are signals having different phases.

The first voltage input terminal Vin1 is supplied with the first low voltage Vss1 corresponding to the gate-off voltage. The second voltage input terminal Vin2 is supplied with the second low voltage Vss2 that is lower than the first low voltage Vss1. The voltage values of the first low voltage Vss1 and the second low voltage Vss2 may be varied according to the exemplary embodiment. In this present exemplary embodiment, the first low voltage Vss1 is −5V and the second low voltage Vss2 is −10V.

For clarity of illustration, FIG. 2 omits wires transmitting the output of the transmission signal output terminals CRout. The connectivity of the transmission signal output terminals CRout will be summarized as follows. Briefly describing the general rule, the transmission signal CR as the output of the transmission signal output terminal CRout is transmitted to the first input terminal IN1 of the following stage, to the second input terminal IN2 of the previous stage, and to the third input terminal IN3 of the stage before the previous stage. The exceptions to this rule at the ends of the chain were described above.

The operation of the gate driver 500 will now be described.

The first stage SR1 receives the first clock signal CKV provided from the outside through the clock input terminal CK, the scan start signal STVP through the first input terminal IN1, and the first and second low voltages Vss1 and Vss2 through the first and second voltage input terminals Vin1 and Vin2. The first stage SR1 also receives the transmission signal CR provided by the second stage SR2 through the second input terminal IN2; and it receives the transmission signal CR provided by the third stage SR3 through the third input terminal IN3, such that the gate-on voltage is output to the first gate line G1 through the gate voltage output terminal OUT. The transmission signal output terminal CRout outputs the transmission signal CR to the first input terminal IN1 of the second stage SR2.

The second stage SR2 receives the second clock signal CKVB provided from the outside through the clock input terminal CK, the transmission signal CR of the first stage SR1 through the first input terminal IN1, and the first and second low voltages Vss1 and Vss2 through the first and second voltage input terminals Vin1 and Vin2. The second stage SR2 also receives the transmission signal CR provided by the third stage SR3 through the second input terminal IN2; and it receives the transmission signal CR provided by the fourth stage SR4 through the third input terminal IN3, such that the gate-on voltage is output to the second gate line G2 through the gate voltage output terminal OUT. The transmission signal CR is output through the transmission signal output terminal CRout to the first input terminal IN1 of the third stage SR3 and to the second input terminal IN2 of the first stage SR1.

The third stage SR3 receives the first clock signal CKV provided from the outside through the clock input terminal CK, the transmission signal CR of the second stage SR2 through the first input terminal IN1, and the first and second low voltages Vss1 and Vss2 through the first and second voltage input terminals Vin1 and Vin2. The third stage SR3 also receives the transmission signal CR provided by the fourth stage SR4 through the second input terminal IN2; and it receives the transmission signal CR provided by the fifth stage SR5 through the third input terminal IN3, such that the gate-on voltage is output to the third gate line G3 through the gate voltage output terminal OUT. The transmission signal CR is output through the transmission signal output terminal CRout to the first input terminal IN1 of the fourth stage SR4; to the third input terminal IN3 of the first stage SRL and to the second input terminal IN2 of the second stage SR2.

According to the above scheme, the n-th stage SRn receives the second clock signal CKVB provided from the outside through the clock input terminal CK; the transmission signal CR of the (n−1)-th stage SR(n−1) through the first input terminal IN1; the first and second low voltages Vss1 and Vss2 through the first and second voltage input terminals Vin1 and Vin2; and the transmission signals CR respectively provided by the (n+1)-th stage SR(n+1) (i.e., the first dummy stage Dummy1) and the (n+2)-th stage SR(n+2) (i.e., the second dummy stage Dummy2) through the second and third input terminals IN2 and IN3; such that the gate-on voltage is output to the n-th gate line Gn through the gate voltage output terminal OUT. The transmission signal CR of stage SRn is output through the transmission signal output terminal CRout to the first input terminal IN1 of the (n+1)-th stage SR(n+1) (i.e., the first dummy stage Dummy1); to the third input terminal IN3 of the (n−2)-th stage SR(n−2); and to the second input terminal IN2 of the (n−1)-th stage SR(n−1).

Next the operation of the dummy stages Dummy1 and Dummy2 will be described.

The n-th stage SRn receives the second clock signal CKVB provided from the outside through the clock input terminal CK, the transmission signal CR of the (n−1)-th stage SR(n−1) through the first input terminal IN1, the first and second low voltages Vss1 and Vss2 through the first and second voltage input terminals Vin1 and Vin2, and the transmission signals CR respectively provided by the (n+1)-th stage SR(n+1) (the first dummy stage Dummy1) and the (n+2)-th stage SR(n+2) (the second dummy stage Dummy2) through the second and third input terminals IN2 and IN3, such that the gate-on voltage is output to the n-th gate line Gn through the gate voltage output terminal OUT.

The first dummy stage Dummy1 receives the first clock signal CKV provided from the outside through the clock input terminal CK, the transmission signal CR of the n-th stage SRn through the first input terminal IN1, the first and second low voltages Vss1 and Vss2 through the first and second voltage input terminals Vin1 and Vin2, and the transmission signal CR and the scan start signal STVP provided by the second dummy stage Dummy2 through the second and third input terminals IN2 and IN3, respectively, such that the Dummy1 gate-on voltage is output to the connected dummy gate line through the gate voltage output terminal OUT. Also, the transmission signal output terminal CRout outputs the transmission signal CR to the first input terminal IN1 of the second dummy stage Dummy2; to the third input terminal IN3 of the (n−1)-th stage SRn−1; and to the second input terminal IN2 of the n-th stage SRn.

Finally, the second dummy stage Dummy2 receives the second clock signal CKVB provided from the outside through the clock input terminal CK, the transmission signal CR from the first dummy stage Dummy1 through the first input terminal IN1, the first and second low voltages Vss1 and Vss2 through the first and the second voltage input terminals Vin1 and Vin2, respectively, and the scan start signal STVP through the second input terminal IN2, such that the gate-on voltage is output to the connected dummy gate line through the gate voltage output terminal OUT. The transmission signal output terminal CRout of Dummy2 outputs the transmission signal CR to the third input terminal IN3 of the n-th stage SRn and to the second input terminal IN2 of the first dummy stage Dummy1. That is, the second dummy stage Dummy2 does not require a third input terminal IN3.

The connection structure of all the stages SR of the entire gate driver 500 was described through FIG. 2. Next the structure of a normal stage SR of a gate driver connected to one gate line will be described with reference to FIG. 3.

FIG. 3 is an enlarged circuit diagram of one stage SR connected to one gate line in FIG. 2. Referring to FIG. 3, each normal stage SR of the gate driver 500 according to the present exemplary embodiment includes an input section 511, a pull-up driver 512, a transmission signal generator 513, an output unit 514, and a pull-down driver 515.

The input section 511 includes one transistor (the fourth transistor Tr4). The input terminal and the control terminal of the fourth transistor Tr4 are commonly connected (diode-connected) to the first input terminal IN1, and the output terminal of Tr4 is connected to a node Q (hereinafter referred to as the first node). The input section 511 has the function of transmitting the high/on voltage to the node Q when the first input terminal IN1 is supplied with the high voltage.

The pull-up driver 512 includes two transistors (the seventh transistor Tr7 and the twelfth transistor Tr12). Firstly, the control terminal and the input terminal of the twelfth transistor Tr12 are diode-connected, so that the first clock signal CKV or the second clock signal CKVB is received through the clock terminal CK. The output terminal of Tr12 is connected to the control terminal of the seventh transistor Tr7 and to the pull-down driver 515. The input terminal of the seventh transistor Tr7 is also connected to the clock terminal CK, and the output terminal of Tr7 is connected to the node Q' (hereinafter referred to as the second node) and is passed through the node Q', thereby being connected to the pull-down driver 515. The control terminal of the seventh transistor Tr7 is connected to the output terminal of the twelfth transistor Tr12 and to pull-down driver 515. Here, a parasitic capacitance (not shown) may be respectively formed between the input terminal and the control terminal, and the control terminal and the output terminal, of the seventh transistor Tr7. If the pull-up driver 512 is supplied with a high signal at the clock terminal CK, the high signal is transmitted to the control terminal of the seventh transistor Tr7 and thence to the pull-down driver 515 through the twelfth transistor Tr12. A high signal transmitted to the seventh transistor Tr7 turns on Tr7, and as a result the high signal supplied by the clock terminal CK passes to the node Q'.

The transmission signal generator 513 includes one transistor, the fifteenth transistor Tr15. The input terminal of the fifteenth transistor Tr15 is connected to the clock terminal CK, thereby receiving the first clock signal CKV or the second clock signal CKVB. The control terminal of Tr15 is connected to the output terminal of the input section 511, i.e., to the node Q; and the output terminal of the fifteenth transistor Tr15 is connected to the transmission signal output terminal CRout outputting the transmission signal CR. Here, a parasitic capacitance (not shown) may be formed between the control terminal and the output terminal of Tr15. In addition to being connected to the transmission signal output terminal CRout, the output terminal of the fifteenth transistor Tr15 is connected to the pull-down driver 515, thereby providing the second low voltage Vss2. As a result, when the transmission signal CR is low, the output voltage value is the second low voltage Vss2.

The output unit 514 includes one transistor (the first transistor Tr1) and one capacitor (the first capacitor C1). The control terminal of the first transistor Tr1 is connected to the node Q. The input terminal of Tr1 receives the first clock signal CKV or the second clock signal CKVB through the clock terminal CK. The first capacitor C1 connects the control terminal and the output terminal of Tr2. And the output terminal of the first transistor Tr1 is connected to the gate voltage output terminal OUT. Additionally, the output terminal OUT is connected to the pull-down driver 515, and thereby receives the first low voltage Vss1. As a result, the value of the gate-off voltage is the first low voltage Vss1. This output unit 514 outputs the gate voltage provided at the node Q modulated by the first clock signal CKV.

The pull-down driver 515 removes charges remaining at the stage SR as a whole to consistently output the gate-off voltage and the low voltage of the transmission signal CR. To perform this charge removal, the pull-down driver 515 must provide the functions of decreasing the potential of the node Q, decreasing the potential of the node Q', decreasing the voltage output to the transmission signal CR, and decreasing the voltage output to the gate line. The pull-down driver 515 includes ten transistors, namely the second transistor Tr2, the third transistor Tr3, the fifth transistor Try, the sixth transistor Tr6, the eighth transistor Tr8 through the eleventh transistor Tr11, the thirteenth transistor Tr13, and the sixteenth transistor Tr16.

Firstly among the pull-down driver transistors, the transistors pulling down the node Q will be described. The transistors pulling down the node Q are the sixth transistor Tr6, the ninth transistor Tr9, the tenth transistor Tr10, and the sixteenth transistor Tr16. The control terminal of the sixth transistor Tr6 is connected to the third input terminal IN3. The output terminal of Tr6 is connected to the second voltage input terminal Vin2; and the input terminal of Tr6 is connected to the node Q. Therefore, the sixth transistor Tr6 is turned on by the transmission signal CR supplied from the stage after the following stage via IN3, with the function of decreasing the voltage of the node Q to the second low voltage Vss2.

The ninth transistor Tr9 and the sixteenth transistor Tr16 are operated together to pull down the node Q. The control terminal of the ninth transistor Tr9 is connected to the second input terminal IN2; the input terminal of Tr9 is connected to node Q; and the output terminal of Tr6 is connected to the input terminal and to the control terminal of the sixteenth transistor Tr16. The control terminal and the input terminal of the sixteenth transistor Tr16 are diode-connected to the output terminal of the ninth transistor Tr9; while the output terminal of Tr16 is connected to the second voltage input terminal Vin2. Therefore, the ninth transistor Tr9 and the sixteenth transistor Tr16 are turned on by the transmission signal CR supplied by the following stage, thereby decreasing the voltage of the node Q to the second low voltage Vss2.

The input terminal of the tenth transistor Tr10 is connected to the node Q; the output terminal thereof is connected to the second low voltage Vss2; and the control terminal thereof is connected to the node Q' (which has the opposite voltage to that of the node Q, such that it is referred to as a reverse terminal). Therefore, the tenth transistor Tr10 continuously decreases the voltage of the node Q to the second low voltage Vss2 in the interval when the node Q' is at high voltage, and then not decreasing the voltage of the node Q when the voltage of the node Q' falls to low voltage. When the voltage of the node Q is not decreased, the corresponding stage outputs the gate-on voltage and the transmission signal CR.

The transistors in the pull-down driver 515 pulling down the node Q' will now be described. The transistors pulling down the node Q' are the fifth transistor Tr5, the eighth transistor Tr8, and the thirteenth transistor Tr13.

The control terminal of the fifth transistor Tr5 is connected to the first input terminal IN1; the input terminal thereof is connected to the node Q'; and the output terminal thereof is connected to the second voltage input terminal Vin2. Consequently, the fifth transistor Tr5 decreases the voltage of the node Q' to the second low voltage Vss2, modulated by the transmission signal CR of the previous stage.

The eighth transistor Tr8 has its control terminal connected to the transmission signal output terminal CRout of the corresponding stage, the input terminal connected to the node Q', and the output terminal connected to the first voltage input terminal Vss1. Hence the eighth transistor Tr8 decreases the voltage of the node Q' to the first low voltage Vss1 as modulated by the transmission signal CR of the corresponding stage.

The thirteenth transistor Tr13 has the control terminal connected to the transmission signal output terminal CRout of the corresponding stage, the input terminal connected to the output terminal of the twelfth transistor Tr12 of the pull-up driver 512, and the output terminal connected to the first voltage input terminal Vint. As a result, the thirteenth transistor Tr13 decreases the inner potential of the pull-up driver 512 to the first low voltage Vss1, and decreases the voltage of the node Q' connected to the pull-up driver 512 to the first low voltage Vss1 modulated by the transmission signal CR of the corresponding stage. In other words, the thirteenth transistor Tr13 functions strictly to discharge the inner charges of the pull-up driver 512 to the first low voltage Vss1. Nevertheless, the pull-up driver 512 is also connected to the node Q' for the voltage of the node Q' to avoid being pulled up, such that the thirteenth transistor Tr13 assists in decreasing the voltage of the node Q' to the first low voltage Vss1.

The transistor decreasing the voltage output to the transmission signal CR in the pull-down driver 515 will now be described. Those transistors are the eleventh transistor Tr11 and the seventh transistor Tr17.

The eleventh transistor Tr11 has its control terminal connected to the node Q', the input terminal connected to the transmission signal output terminal CRout, and the output terminal connected to the second voltage input terminal Vin2. As a result, when the voltage of the node Q' is high, the voltage of the transmission signal output terminal CRout is decreased to the second low voltage Vss2 such that the transmission signal CR is changed to the low level.

The seventeenth transistor Tr17 has its control terminal connected to the second input terminal IN2, the Tr17 input terminal connected to the transmission signal output terminal CRout, and the output terminal connected to the second voltage input terminal Vin2. Consequently, the seventeenth transistor Tr17 is turned on by the transmission signal CR supplied from the following stage such that the voltage of the transmission signal output terminal CRout is decreased to the second low voltage Vss2, and as a result, the transmission signal CR is changed to the low level.

The transistors decreasing the voltage output to the gate line from the pull-down driver 515 will now be described. The transistors decreasing the voltage output to the gate line are the second transistor Tr2 and the third transistor Tr3.

The second transistor Tr2 has its control terminal connected to the second input terminal IN2, the input terminal connected to the gate voltage output terminal OUT, and the output terminal connected to the first voltage input terminal Vint. As a result, the gate voltage output is changed to the first low voltage Vss1 when the transmission signal CR of the following stage is output.

The third transistor Tr3 has its control terminal connected to the node Q', the input terminal connected to the gate voltage output terminal OUT, and the output terminal connected to the first voltage input terminal Vint. As a result, the gate voltage output is changed to the first low voltage Vss1 when the voltage of the node Q' is high.

In the pull-down driver 515, the gate voltage output terminal OUT is only decreased to the first low voltage Vss1, whereas the node Q and the transmission signal output terminal CRout are decreased to the second low voltage Vss2 that is lower than the first low voltage Vss1. Accordingly, although the gate-on voltage and the high voltage of the transmission signal CR may be the same voltage, the gate-off voltage and the low voltage of the transmission signal CR are different voltages. That is, the gate-off voltage is the first low voltage Vss1, and the low voltage of the transmission signal CR is the second low voltage Vss2.

The gate voltage and transmission signal CR may have various voltage values. In the present exemplary embodiment, the gate-on voltage may be +25V; the gate-off voltage and the first low voltage Vss1 may be −5V; the high voltage of the transmission signal CR may be +25V; and the low voltage of the transmission signal CR and the second low voltage Vss2 may be −10V.

In summary, the transmission signal generator 513 and the output unit 514 are controlled by the voltage of the node Q such that one stage SR outputs the high voltage of the transmission signal CR and the gate-on voltage; the transmission signal CR decreases from the high voltage to the second low voltage Vss2 given the transmission signals CR of the previous, the following, and the stage after the following stage; and the gate-on voltage decreases to the first low voltage Vss1, thereby becoming the gate-off voltage. The one stage SR decreases the voltage of the node Q to the second low voltage Vss2 by the transmission signal CR from the stage after the following stage, as well as from the following transmission signal CR to reduce the stage's power consumption. The second low voltage Vss2 is sufficiently low that the transistors of the stage significantly reduce their leakage current, thereby decreasing the power consumption even though the transmission signal CR supplied to different stages may include ripple or noise.

Next, a structure of the gate driver's dummy stages Dummy1 and Dummy2 connected to the dummy gate line will be described through FIG. 4 and FIG. 5, respectively, in detail.

The first dummy stage Dummy1 will be described with reference to FIG. 4. The first dummy stage Dummy1 is entirely similar to the layout of the normal stage SR except for regions A and B of FIG. 4.

Region A shows the connection structure of the seventeenth transistor Tr17, which is different from the normal stage SR. The seventeenth transistor Tr17 in the first dummy stage Dummy1 has its control terminal connected to the first input terminal IN1, the input terminal connected to the transmission signal output terminal CRout, and the output terminal connected to the second voltage input terminal Vin2. The control terminal of the seventeenth transistor Tr17 in the normal stage SR is connected to the second input terminal IN2; yet the control terminal of the seventeenth transistor Tr17 in the first dummy stage Dummy1 is connected to the first input terminal IN1. Consequently, the voltage controlling the seventeenth transistor Tr17 of Dummy1 is the transmission signal CR supplied by the previous stage (the n-th stage, SRn). Therefore the voltage of the transmission signal output terminal CRout decreases to the second low voltage Vss2, and so the transmission signal CR changes to the low level.

Also, in region B the sixteenth transistor Tr16 is omitted. That is, no element is present at the position corresponding to the sixteenth transistor Tr16 of the normal stage. The sixteenth transistor Tr16 is diode-connected in the normal stage so it lacks an additional operation characteristic, which accounts for its omission in the first dummy stage Dummy1.

The remaining circuit structure of the first dummy stage Dummy1 is the same as that of a normal stage, except that the third input terminal IN3 is connected to the scan start signal STVP since the stage after the following stage does not exist for Dummy1.

Next, the second dummy stage Dummy2 will be described with reference to FIG. 5. The second dummy stage Dummy1 is different from the normal stage SR in regions A, B, C, and D of FIG. 5.

In region A, as in the first dummy stage Dummy1, the control terminal of the seventeenth transistor Tr17 is connected to the first input terminal IN1. The seventeenth transistor Tr17 in the second dummy stage Dummy2 has the control terminal connected to the first input terminal IN1, the input terminal connected to the transmission signal output terminal CRout, and the output terminal connected to the second voltage input terminal Vin2. As a result, the voltage controlling the seventeenth transistor Tr17 is the transmission signal CR supplied by the previous stage (the first dummy stage, Dummy1). Therefore the voltage of the transmission signal output terminal CRout decreases to the second low voltage Vss2, and so the transmission signal CR changes to the low level.

In region B of Dummy2, the sixteenth transistor Tr16 is omitted as for the first dummy stage Dummy1. That is, any additional element is absent at the position corresponding to the sixteenth transistor Tr16 of a normal stage. The sixteenth transistor Tr16 is diode-connected in the normal stage such that it has no additional operation characteristic, thereby being omitted as in the first dummy stage Dummy1. For the second dummy stage Dummy2, the stage after the following stage does not exist, so Dummy2's third input terminal IN3 also does not exist. Hence Dummy2 does not require a sixth transistor Tr6 connected to the (absent) third input terminal IN3. That is, no additional element is present at the position corresponding to the sixteenth transistor Tr16 of a normal stage, with reference to FIG. 5 C.

Differing from the normal stage SR and the first dummy stage Dummy1, the second dummy stage Dummy2 additionally includes an eighteenth transistor Tr18 and a nineteenth transistor Tr19, with reference to FIG. 5 D. The control terminal of the eighteenth transistor Tr18 is connected to the second input terminal IN2; the input terminal is connected to the transmission signal output terminal CRout; and the output terminal is connected to the second voltage input terminal Vin2. Thus the voltage of the transmission signal output terminal CRout falls to the second low voltage Vss2 as modulated by the input signal of the second input terminal IN2. In this second dummy stage Dummy2, the second input terminal IN2 must be supplied by the transmission signal CR of the following stage. Since the following stage does not exist, however, the scan start signal STVP is supplied instead. Therefore, the eighteenth transistor Tr18 changes the voltage of the transmission signal output terminal CRout to the second low voltage Vss2 based upon the scan start signal STVP.

The second additional transistor in the second dummy stage Dummy2, the nineteenth transistor Tr19, includes the control terminal connected to the transmission signal output terminal CRout; the input terminal connected to the control terminal (i.e., Q node) of the fifteenth transistor Tr15; and the output terminal connected to the second voltage input terminal Vin2. As a result, the voltage of the Q node is ramped to a low voltage following the voltage of the transmission signal output terminal CRout.

The additional transistors of the second dummy stage Dummy2, the eighteenth transistor Tr18 and the nineteenth transistor Tr19, receive the additional transmission signal CR from the following stage to prevent decreasing the voltage of the Q node and of the transmission signal output terminal CRout. Consequently, the gate driver 500 may be operated normally for a long time while the second dummy stage Dummy2 forestalls accumulation of excess charge.

The remainder of the second dummy stage's circuit structure is similar to that of the normal stage. However, the second dummy stage Dummy2 does not include a third input terminal IN3; and the second input terminal IN2 is supplied with the scan start signal STVP because the following stage does not exist.

For the gate driver 500 as described above in an exemplary embodiment, the scan start signal STVP is transmitted to the first stage SR1 among the normal stages SR and to the two dummy stages Dummy1 and Dummy2.

If only one wire transmits the scan start signal STVP, a region exists where the wire supplying the scan start signal STVP overlaps the wire carrying the clock signal. This occurs because the scan start signal STVP is supplied to the first stage SR1 among the stages and to the last stages Dummy1 and Dummy2, while the clock signal is carried to all stages SR1-SRn and to the stages Dummy1 and Dummy2, creating one region of overlap for each stage. These regions of overlap are depicted in FIG. 2 where the dotted line portion of STVP1 (the hypothetical sole start signal wire) intersects the clock signal lines.

In this conception, interference between the scan start signal STVP and the overlapping clock signal delays the scan start signal STVP, so the corresponding stage's gate-on voltage is mistimed.

When implementing an exemplary embodiment of the present disclosure, however, the same scan start signal STVP is transmitted through two wires (referring to STVP1 and STVP2 of FIG. 1) that are divided, which overlap the wire carrying the clock signal minimally or not at all depending on the layout. That is, when one wire STVP2 supplies the scan start signal STVP to the first stage SR1, one wire STVP1 supplies the identical scan start signal STVP to the last two stages Dummy1 and Dummy2, and the two wires STVP1 and STVP2 are disposed on opposite sides of the wire carrying the clock signal, one may form wire paths that do not overlap one another.

The resulting output timing of the gate-on voltage is not delayed by interference with the scan start signal STVP. And in consequence horizontal banding image artifacts are avoided, while accommodating a narrow bezel.

The above-described wiring scheme will be described in detail with reference to FIG. 6 and FIG. 7.

Figure 6:
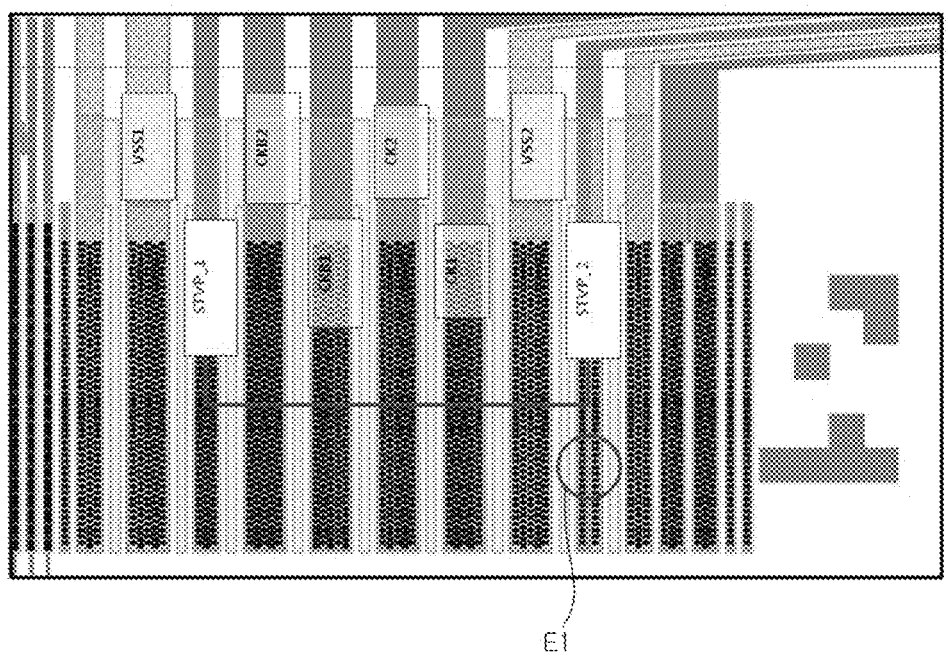
FIG. 6 to FIG. 8 are enlarged views showing an arrangement of a signal wires connected to a gate driver in a display panel.
Figure 7:
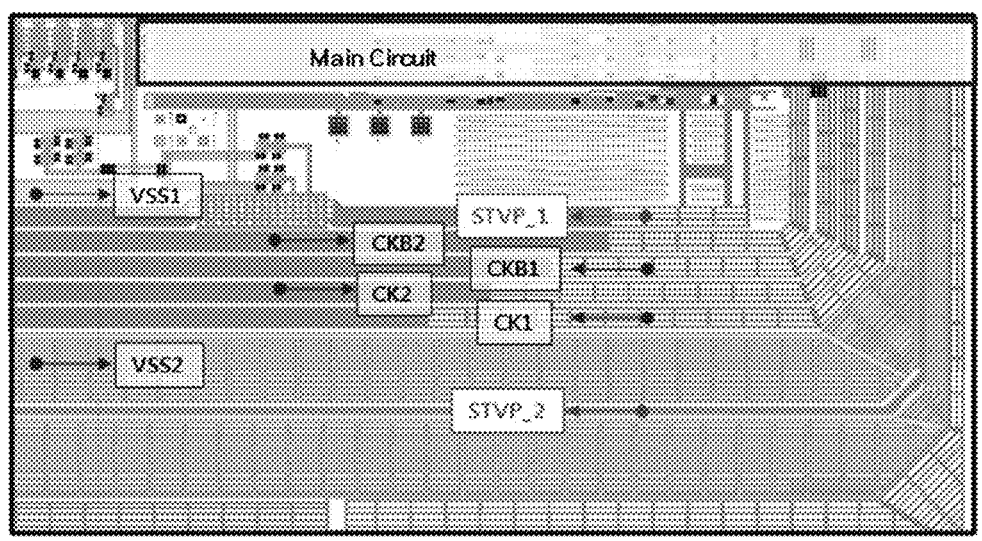
Figure 8:
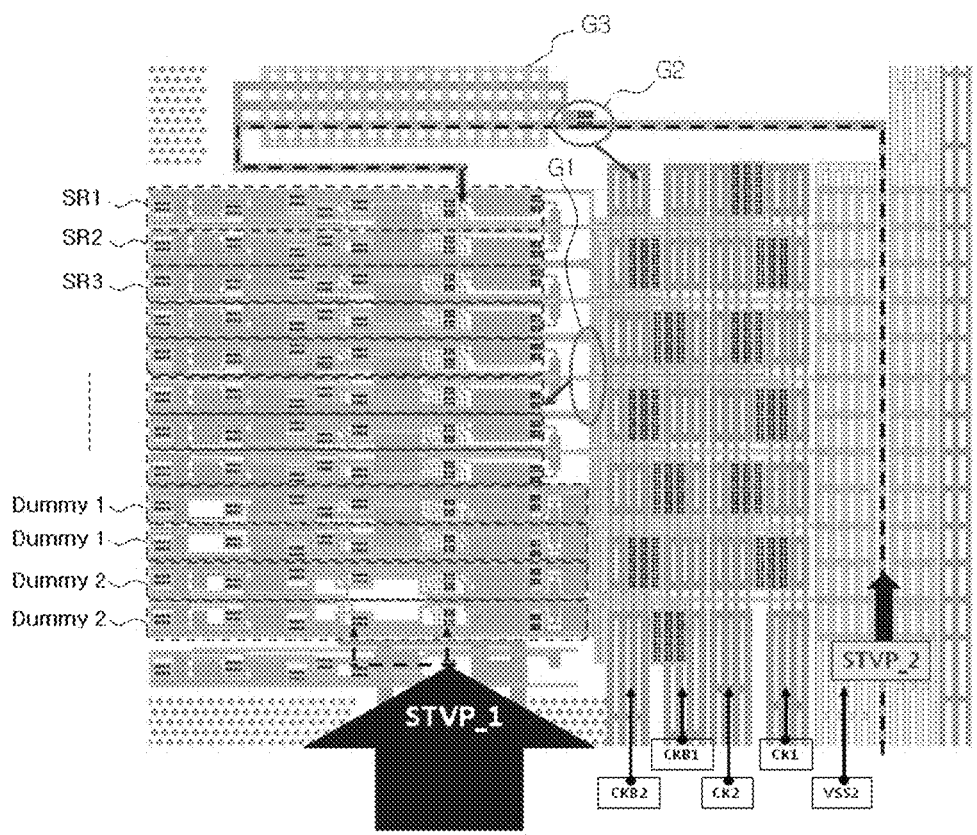

FIG. 6 to FIG. 8 are enlarged layout views showing arrangements of signal wires supplied to a gate driver in a display panel according to an exemplary embodiment.

FIG. 6 is an enlarged layout view of region E of FIG. 1. FIG. 7 is an enlarged layout view of region F of FIG. 1. And FIG. 8 is an enlarged layout view of region G of FIG. 1. In FIG. 6 through FIG. 8, a green color line is in the same layer as the gate line; an orange color line is in the same layer as the data line; a sky blue color line is in the same layer as the pixel electrode; and a black color portion represents a contact hole.

FIG. 6 will be described initially.

The sector shown in FIG. 6 as an enlarged region E of FIG. 1 shows a gate driver control wire in an area where the flexible printed circuit film 450 and the display panel 100 are connected. As shown in FIG. 1, the gate driver control wiring according to an exemplary embodiment passes through the flexible printed circuit film 450 attached to the lower right side of the display panel 100.

As shown in FIG. 6, the gate driver control wiring comprises a sequence (from right to left) of the second scan start signal wire STVP2 carrying the scan start signal STVP; a wire supplying the second low voltage Vss2; wires CK1 and CK2 transmitting the first clock signal CKV; wires CKB1 and CKB2 transmitting the second clock signal CKVB; the first scan start signal wire STVP1 carrying the scan start signal STVP; and a wire supplying the first low voltage Vss1 from the leftmost side. In the exemplary embodiment shown in FIG. 6, a total of four wires carrying clock signals are shown, with the wire CK1 and the wire CKB1 supplying clock signals having opposite phases, and the wire CK2 and the wire CKB2 carrying clock signals having opposite phases. Also, the wire CK1 and the wire CK2 may carry clock signals having different phases. While FIG. 1 is an exemplary embodiment of supplying two clock signals, FIG. 6 is an exemplary embodiment of supplying four clock signals. Equally significant is the layout of the two wires STVP1 and STVP2 supplying the scan start signal, which are formed on opposite sides of the wires carrying the clock signal.

Two wires STVP1 and STVP2 supplying the scan start signal are divided into two on the display panel 100. The applied signals, however, are identical such that one wire is supplied with the scan start signal STVP on the printed circuit board (PCB) 400; then the wire is divided into two wires in the flexible printed circuit film 450, thereby supplying the scan start signals STVP in two wires STVP1 and STVP2 to the display panel 100. According to another exemplary embodiment depicted in FIG. 9, one wire may be divided into two wires in the flexible printed circuit film 450.

In an exemplary embodiment, the wires CK1, CK2, CKB1, and CKB2 carrying the clock signal are formed on the same layer; and the two wires Vint and Vin2 supplying the low voltage are formed on the same layer as the data line. The first scan start signal wire STVP1 of the wires supplying the scan start signal STVP is formed on the same layer as the gate line, and the second scan start signal wire STVP2 is formed with the dual layer of the gate line and the data line. The dual-layered structure of the second scan start signal wire STVP2 may ensure the reliability of the signal transmission when a space to form the second scan start signal wire STVP2 is not sufficient, as the trend toward decreasing bezel width of the display device progresses. According to an exemplary embodiment, however, the second scan start signal wire STVP2 may be formed with a single layer.

FIG. 6 shows a structure in which each gate driver control wire is extended in a direction parallel to the data line and is bent in an oblique direction after receiving the signal from the flexible printed circuit film 450.

To transmit the signal from the flexible printed circuit film 450 to each wire of the display panel 100, a structure connecting them using a transparent conductive layer (for example, ITO, IZO, etc.) for forming a pixel electrode and a contact hole is provided. A plurality of contact holes is shown in FIG. 6, for example in region E1. The contact holes of FIG. 6 are formed for each wire to connect the wires through the contact holes. This measure ensures the contact reliability between the flexible printed circuit film 450 and the wires on the display panel 100, so the signals are transmitted consistently under folding and unfolding of the flexible printed circuit film 450.

Still with reference to FIG. 6, a control signal may be applied outside the second scan start signal wire STVP2 according to an exemplary embodiment, and a static electricity preventing conductor to prevent static electricity from discharging may be formed. A gate line pattern formed at the rightmost side in FIG. 6 is an alignment mark for registration.

The structure in which the signal is transmitted to each wire of the display panel 100 from the printed circuit board (PCB) 400 through the flexible printed circuit film 450 was described through the exemplary embodiment of FIG. 6.

Next, a wiring structure in which each wire connects to the gate driver 500 to fit within the bezel part of display panel 100 will be described with reference to FIG. 7. The portion shown in FIG. 7 as an enlarged region F of FIG. 1 shows a structure of gate driver control wiring which carries the signals transmitted from the flexible printed circuit film 450 to the gate driver 500.

Referring to FIG. 7, each gate driver control wire has a structure in which the wiring provided from the flexible printed circuit film 450 is extended in the direction parallel to the gate line, bends in an oblique direction, and then is finally extended in the direction parallel to the data line.

If the gate driver control wire sequence is described starting from the inside (shortest path), the wire supplied with the first low voltage Vss1 extends in the direction parallel to the gate line, and then bends in the direction of the data line. That is, the wire Vin1 supplied with the first low voltage Vss1 to a corner of a region G where all stages SR are formed, and the wire bends before reaching the stages SR. In this structure, the wire Vin1 extends in the direction of the data line between the display area 300 and all stages SR, similar to the wire Vss1 of FIG. 2.

The other gate driver control wires formed outside the wire supplied with the first low voltage Vss1 all extend in the direction parallel to the gate line until they pass a region of the stages SR ("main circuit" shown in FIG. 7). Then those wires continue to extend past the stages SR, and are lastly bent parallel to the direction of the data line. That is, the first scan start signal wire STVP1 carrying the scan start signal STVP bends parallel to the data line at the end portion of the stage SR, and transmits the scan start signal STVP to the dummy stages Dummy1 and Dummy2 positioned at the lower portion of the gate driver 500. The remaining gate driver control wires are all bent after passing the stage SR, and the wires CKB1 and CKB2 supplied with the second clock signal CKVB, the wires CK1 and CK2 supplied with the first clock signal CKV, the wire Vin2 relaying the second low voltage Vss2, and the second scan start signal wire STVP2 carrying the scan start signal STVP are arrayed from inside to outside.

The gate driver control wire is formed from the same material as in FIG. 6. That is, the wires CK1, CK2, CKB1, and CKB2 carrying the clock signal are on the same layer as the gate line, two wires Vss1 and Vss2 supplying the low voltages are formed with the same layer as the data line, the first scan start signal wire STVP1 of the wires supplying scan start signals STVP is formed with the same layer as the gate line, and the second scan start signal wire STVP2 is formed with the dual layer of the gate line and the data line. A structure in which each wire transmits to each stage SR of the gate driver 500 according to the outer part of the display panel 100 will now be described in detail. In FIG. 8, the wire relaying the first low voltage Vss1 is not omitted because the wire relaying the first low voltage Vss1 is connected to a terminal, Vin1, formed at the other side of each stage SR as depicted in FIG. 2 and FIG. 7.

The gate driver control wire is formed in the sequence of the wires CKB1 and CKB2 carrying the second clock signal CKVB, the wires CK1 and CK2 supplied with the first clock signal CKV, the wire relaying the second low voltage Vss2, and the second scan start signal wire STVP2 supplying the scan start signal STVP at the right side of each stage SR.

The wire transmitting the clock signal will first be described.

The wires CK1, CK2, CKB1, and CKB2 supplying the clock signal are formed on the same layer as the gate line, yet they have a through-hole connection formed to the layer with the data line to be connected to each stage SR, Dummy1, and Dummy2. That is, the clock signal is transmitted from the gate line layer to the connection of the data line layer through the contact holes. In this structure, the wire of the gate line may be formed under the connection of the data line layer, and the scan start signal STVP may be transmitted as for the dotted line of the wire STVP1 of FIG. 2. In an exemplary embodiment, however, the scan start signal STVP transmitted to the first stage SR1 is carried outside the clock wires CK1, CK2, CKB1, and CKB2 through the second scan start signal wire STVP_2 (referring to an outer arrow and dashed path of FIG. 8) such that the wires transmitting the clock wires CK1, CK2, CKB1, and CKB2 and the scan start signal STVP avoid being overlapped (referring to the region G1 of FIG. 8). As a result, the scan start signal STVP is not delayed. Furthermore, because the scan start signal STVP and the clock signal do not overlap in region G1, excess parasitic capacitance is not generated which would otherwise increase the power consumption. The power consumption is thereby relatively decreased relative to designs in which the clock and scan start signals interfere. In this structure, as distinct from FIG. 8, at least one wire among the wires CK1, CK2, CKB1, and CKB2 carrying the clock signal may not include the connection formed with the data line layer.

The first scan start signal wire STVP_1 supplied with the scan start signal STVP bends under the dummy stages Dummy1 and Dummy2, and divides in two as shown by the large arrow at the lower side of FIG. 8. This wire transmits the scan start signal STVP to each terminal of the first dummy stage Dummy1 and the second dummy stage Dummy2. The first scan start signal wire STVP_1 is formed as in FIG. 8 so that it never overlaps with the wires CK1, CK2, CKB1, and CKB2 relaying the clock signal.

In FIG. 8 the first scan start signal wire STVP_1 is formed on the same layer as the gate line until STVP_1 is connected to the dummy stages Dummy1 and Dummy2. The second scan start signal wire STVP2 is formed with the dual layer, but it is changed into the single layer of the gate line in a portion of the electrostatic protective circuit G3, and thence is connected to the input terminal of the first stage SR1. According to an exemplary embodiment, the electrostatic protective circuit G3 does not overlap the second scan start signal wire STVP2. With additional reference to a region G2 of FIG. 8, although the second scan start signal wire STVP_2 is formed with the dual layer such that the scan start signal STVP is supplied through the layers of the gate line and the data line, the signal of the data line layer passes to the gate line layer through the contact hole. That is, to improve reliability of the signal transmission and to obtain a decrease in resistance, the second scan start signal wire STVP_2 is formed with the dual layer, nonetheless an additional contact hole connection structure is formed for the appropriate signal transmission even if one layer among the dual layer structure is disconnected.

Figure 10:
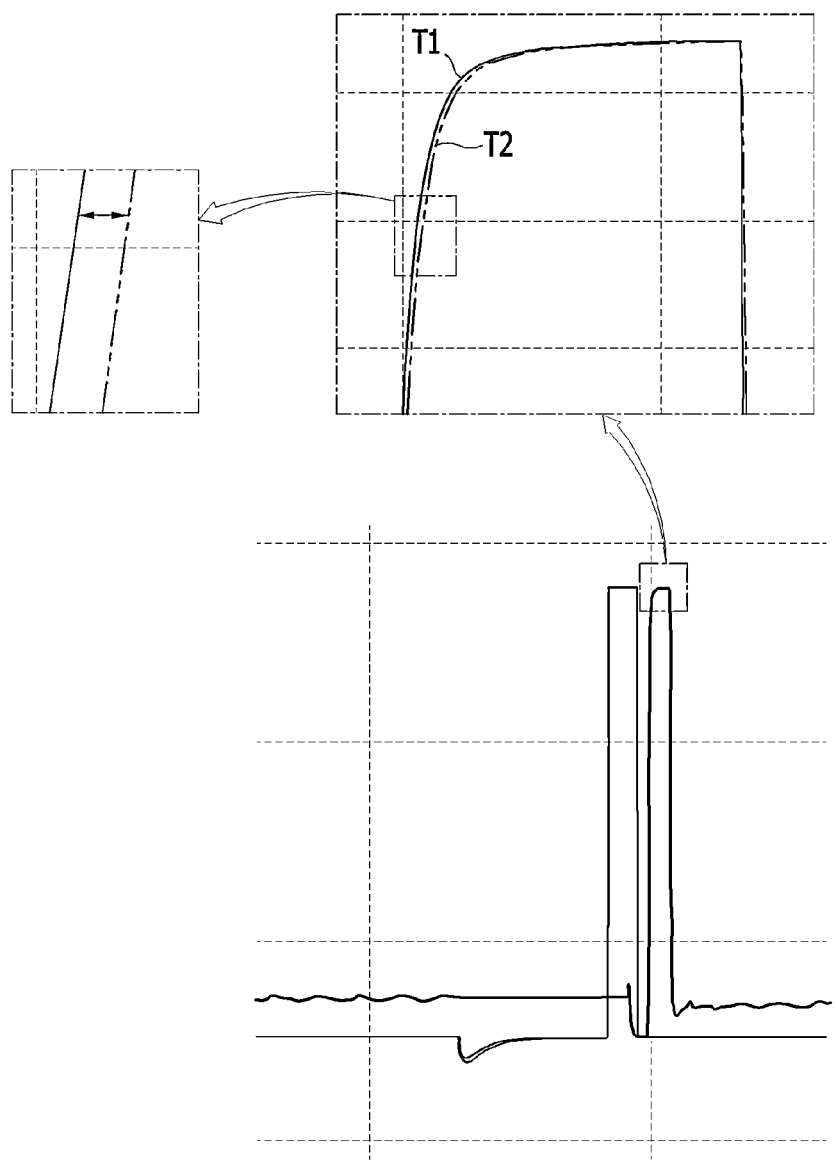
FIG. 10 is a view of a margin of a gate-on voltage generated.

In the structure according to an exemplary embodiment, the wire transmitting the scan start signal STVP is divided into two, one wire among them being disposed at the outer part of the wire transmitting the clock signal such that the degree to which the clock signal and the scan start signal STVP overlap with each other is decreased. Thereby a delay in the scan start signal may be largely prevented, yielding the merit of avoidance of the increase in power consumption due to parasitic capacitance. In particular, although the magnitude of one parasitic capacitance is small, the number of stages SRn in the gate driver 500 corresponds to the number of gate lines n. Thus the additional parasitic capacitance would be generated for all gate lines, such that power consumption may be reduced by about 10% when the clock signal wire and the scan start signal STVP wire do not overlap, as the present disclosure communicates. Another benefit shown in FIG. 10 is that delay of the scan start signal STVP is prevented, enabling the sufficient driving margin with reserve of the gate driver 500.

Figure 9:
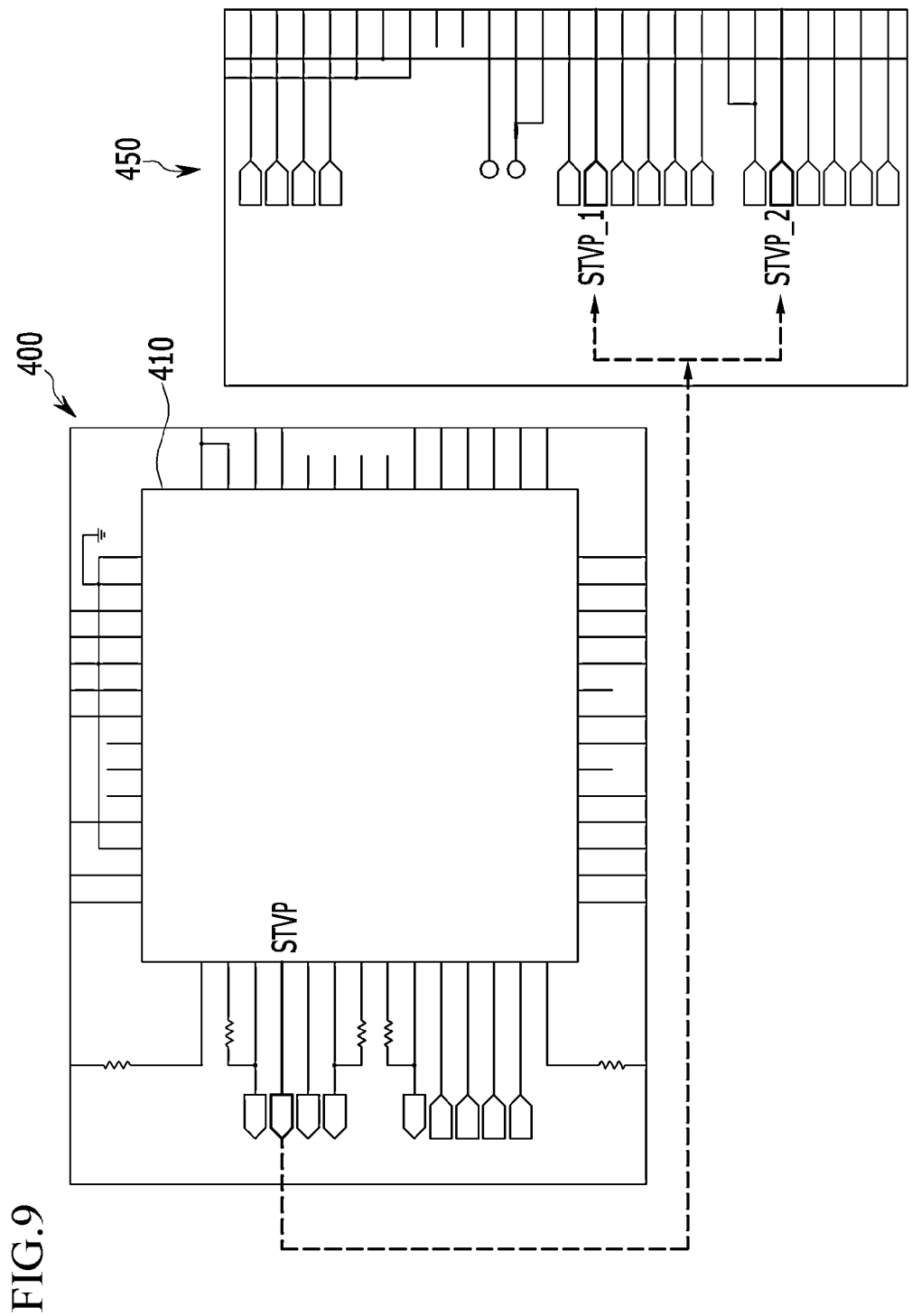
FIG. 9 is a view of a structure for transmitting a scan start signal to a display panel through a printed circuit board (PCB) and a flexible printed circuit film.

FIG. 9 shows an exemplary embodiment in which one scan start signal STVP is divided into two wires in the flexible printed circuit film 450. The view in FIG. 9 is a structure transmitting the scan start signal to the display panel 100 through the printed circuit board (PCB) 400 and flexible printed circuit film 450 according to an exemplary embodiment. The scan start signal STVP output from the driving voltage generating circuit 410 on the printed circuit board (PCB) 400 of FIG. 9 is carried to the flexible printed circuit film 450 and divided into two wires, which are fixed to two output terminals STVP_1 and STVP_2 of the flexible printed circuit film 450 to be output.

FIG. 9 shows one IC of the driving voltage generating circuit 410 as a portion of the printed circuit board (PCB) 400. Each output terminal and the peripheral circuit of the driving voltage generating circuit 410 are schematically shown, and only the output terminal of the scan start signal STVP related to the present disclosure among them is shown. Further, a portion of the flexible printed circuit film 450 is depicted, and only two output terminals STVP_1 and STVP_2 related to the scan start signal STVP among a plurality of output terminals are clearly shown.

According to FIG. 9, the scan start signal STVP is transmitted through one wire in the printed circuit board (PCB) 400, but one wire is divided into two wires in the flexible printed circuit film 450 and the scan start signal STVP is transmitted to the two wires STVP1 and STVP2 of the display panel 100 through two output terminals STVP_1 and STVP_2.

According to an exemplary embodiment, however, the scan start signal STVP may be divided into two in the printed circuit board (PCB) 400 and these may be transmitted to the flexible printed circuit film 450.

If an output gate-on voltage is simulated through the above-described exemplary embodiment, the output of FIG. 10 is obtained.

FIG. 10 is a view showing a margin of a gate-on voltage generated according to an exemplary embodiment. The horizontal axes of FIG. 10 represent time and the vertical axes represent voltage.

FIG. 10 shows two gate-on voltages, indicated by T1 and T2. T1 is the gate-on voltage in the first stage SR1 according to an exemplary embodiment, and T2 is the gate-on voltage in the first stage SR1 according to a comparative example.

The comparative example of T2 is a case in which the scan start signal STVP supplied to the first stage SR1 is transmitted while overlapping the clock signal line.

When increasing the gate-on voltage in FIG. 10, a timing lag between the voltages of T1 and T2 appears. An arrow representing the time interval between two identical voltages of FIG. 10 represents the time difference between the exemplary embodiment and the comparative example. As a simulation result, a difference of 0.15 μs is measured for +25V. This may confirm that the gate-on voltage timing is late due to the delay of the scan start signal STVP when the scan start signal STVP overlaps the clock signal, as for T2. Thus in implementing the present invention, these data confirm that the delay of the scan start signal STVP is small such that an ample driving margin may be maintained for the gate-driving signal.

| <Description of Symbols> | |
|---|---|
| 100: display panel | 300: display area |
| 400: printed circuit board (PCB) | 450: flexible printed circuit film |
| 460: data driver IC | 500: gate driver |
| 511: input section | 512: pull-up driver |
| 513: transmission signal generator | 514: output unit |
| 515: pull-down driver | 600: signal controller |
| STVP: scan start signal | |

What is claimed is:

1. A display panel comprising:
a display area including a gate line and a data line; and
a gate driver connected to one end of the gate line, including a plurality of normal stages and dummy stages, integrated on a substrate
wherein a scan start signal output from a driving voltage generating circuit on a printed circuit board is transmitted by one wire in the printed circuit board, and the one wire is divided into a first scan start signal wire and a second scan start signal wire in a flexible printed circuit film connected to the display panel,
the scan start signal is transmitted through the first scan start signal wire and the second scan start signal wire,
the first scan start signal wire is connected to only one or more of the dummy stages and transmits the scan start signal only to the one or more dummy stages, and
the second scan start signal wire is connected to only one normal stage of the plurality of normal stages and transmits the scan start signal only to the one stage of the plurality of normal stages, and wherein the dummy stages comprise a first dummy stage and a second dummy stage and the normal stage comprises a seventeenth transistor, wherein
a control terminal of the seventeenth transistor is connected to a second input terminal of the normal stage;
an input terminal of the seventeenth transistor is connected to a transmission signal output terminal of the normal stage;
and an output terminal of the seventeenth transistor is connected to a second voltage input terminal of the normal stage; and wherein
the first dummy stage and the second dummy stage also each include a seventeenth transistor,
the seventeenth transistors of each of the first and second dummy stages comprising a transistor control terminal connected to a dummy stage first input terminal, a transistor input terminal connected to a dummy stage transmission signal output terminal, and a transistor output terminal connected to a dummy stage second voltage input terminal.

2. The display panel of claim 1, wherein
the plurality of normal stages and the dummy stages are disposed in one line, and are alternately supplied with a clock signal by wire.

3. The display panel of claim 2, wherein
the first scan start signal wire and the second scan start signal wire are formed on opposite sides of the wire supplying the clock signal.

4. The display panel of claim 3, wherein
the wire and the first scan start signal wire carrying the clock signal are formed on the same layer as the gate line, and the second scan start signal wire is formed on the same layer as the gate line and the data line, thereby having a dual-layered structure.

5. The display panel of claim 4, wherein
the wire supplying the clock signal has a connection to the plurality of normal stages and dummy stages, and the connection is formed on the same layer as the data line.

6. The display panel of claim 4, wherein
the second scan start signal wire is only formed on the same layer as the gate line at a portion connected to the first stage.

7. The display panel of claim 3, wherein
the flexible printed circuit is attached to one side of the display panel and the printed circuit board (PCB) is attached to the other end of the flexible printed circuit, and
one scan start signal is output in the driving voltage generating circuit of the printed circuit board (PCB), and the flexible printed circuit divides one scan start signal into two wires and transmits them separately to the display panel.

8. The display panel of claim 3, wherein
each normal stage receives the clock signal, a first low voltage and a second low voltage lower than the first low voltage, at least one transmission signal from among previous stages, and at least two transmission signals from among following stages to output a gate voltage having the first low voltage as a gate-off voltage.

9. The display panel of claim 8, wherein
the gate voltage when the transmission signal is low is the second low voltage.

10. The display panel of claim 8, wherein
the normal stage comprises an input section, a pull-up driver, a pull-down driver, an output unit, and a transmission signal generator.

11. The display panel of claim 1, wherein
the first dummy stage receives the clock signal, the first low voltage and the second low voltage lower than the first low voltage, at least one transmission signal from among the previous stages, at least one transmission signal from among the following stages, and the scan start signal,
to output a dummy gate voltage having the first low voltage as the gate-off voltage.

12. The display panel of claim 11, wherein
the second dummy stage receives the clock signal, the first low voltage and the second low voltage lower than the first low voltage, the transmission signal of the first dummy stage, and the scan start signal,
to output a dummy gate voltage having the first low voltage as the gate-off voltage.

13. The display panel of claim 1, wherein
the normal stage comprises a diode-connected sixteenth transistor, and
the first dummy stage and the second dummy stage do not form an additional element at a position corresponding to the sixteenth transistor.

14. The display panel of claim 1, wherein
the normal stage and the first dummy stage each comprise a sixth transistor, wherein
a control terminal of the sixth transistor is connected to a third input terminal of a stage,
an output terminal of the sixth transistor is connected to a second voltage input terminal of a stage, and an input terminal of the sixth transistor is connected to a Q node of a stage, and the second dummy stage does not form an additional element at a position corresponding to the sixth transistor and does not have a third input terminal.

15. The display panel of claim 1, wherein the second dummy stage further comprises an eighteenth transistor, wherein the control terminal of the eighteenth transistor is connected to a second input terminal of the second dummy stage, an input terminal of the eighteenth transistor is connected to a transmission signal output terminal of the second dummy stage, and an output terminal of the eighteenth transistor is connected to a second voltage input terminal.

16. The display panel of claim 15, wherein the second dummy stage further comprises a nineteenth transistor, wherein the control terminal of the nineteenth transistor is connected to a transmission signal output terminal of the second dummy stage, an input terminal of the nineteenth transistor is connected to a Q node of the second dummy stage, and an output terminal of the nineteenth transistor is connected to the second voltage input terminal of the second dummy stage.

* * * * *